(12) United States Patent
Gibson et al.

(10) Patent No.: US 7,694,238 B2
(45) Date of Patent: Apr. 6, 2010

(54) SELECTION OF OBSCURED COMPUTER-GENERATED OBJECTS

(75) Inventors: Mark Gibson, Arlington, MA (US); James C. Wilkinson, Andover, MA (US); John Sweeney, Acton, MA (US); Seetharam Misro, Pune (IN)

(73) Assignee: SolidWorks Corporation, Concord, MA (US)

( * ) Notice: Subject to any disclaimer, the term of this patent is extended or adjusted under 35 U.S.C. 154(b) by 1096 days.

(21) Appl. No.: 10/806,571

(22) Filed: Mar. 22, 2004

(65) Prior Publication Data

US 2005/0210444 A1 Sep. 22, 2005

(51) Int. Cl.
*G06F 3/00* (2006.01)
*G06F 9/44* (2006.01)
(52) U.S. Cl. .................... 715/848; 715/849; 715/850; 715/851; 715/852; 717/108
(58) Field of Classification Search ......... 715/848–852; 717/108
See application file for complete search history.

(56) References Cited

U.S. PATENT DOCUMENTS

| 6,628,279 | B1 * | 9/2003 | Schell et al. ............... 345/420 |
| 6,812,940 | B2 * | 11/2004 | Arnold ...................... 715/817 |
| 7,043,701 | B2 * | 5/2006 | Gordon ...................... 715/848 |
| 2002/0089546 | A1 | 7/2002 | Kanevsky |
| 2003/0128242 | A1 | 7/2003 | Gordon |
| 2004/0075697 | A1 * | 4/2004 | Maudlin ...................... 345/848 |

* cited by examiner

*Primary Examiner*—Joshua D Campbell
*Assistant Examiner*—Stephen Alvesteffer
(74) *Attorney, Agent, or Firm*—Baker Hostetler LLP (57) ABSTRACT

Selecting an obscured object of a computer-generated model consisting of a plurality of objects displayed on a computer screen includes receiving input data interpreted as an instruction to change a visibility characteristic of a first one of the plurality of objects (the first one of the objects obscuring another of the objects, and the first object being determined based on the location of an on-screen cursor), and modifying a visibility characteristic of the first object to cause another one of the objects to become discernable and selectable.

22 Claims, 9 Drawing Sheets

SELECTION OF OBSCURED COMPUTER-GENERATED OBJECTS

BACKGROUND OF THE INVENTION

Computer-aided design (CAD) software allows a user to construct and manipulate complex three-dimensional (3D) models of assembly designs. A number of different modeling techniques can be used to create a model of an assembly. These techniques include solid modeling, wire-frame modeling, and surface modeling. Solid modeling techniques provide for topological 3D models, where the 3D model is a collection of interconnected vertices, edges, and faces, for example. Geometrically, a 3D solid model is a collection of trimmed surfaces. The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D. modeling techniques. The design engineer creates parts and may assemble the parts into one or more subassemblies. In addition to parts, a subassembly may also consist of other subassemblies. Using parts and subassemblies, the design engineer designs an assembly. Hereinafter, parts and subassemblies are collectively referred to as components.

In addition to design engineers, engineers in other disciplines may use 3D CAD systems. For example, a manufacturing engineer may use a 3D CAD system to view, and possibly modify, a component to address manufacturing processes used to build the component.

An engineer using a 3D CAD system frequently needs to select an entity in a component, such as a vertex, an edge, or a face. When a CAD model is not displayed as a wire-frame model or when a complex CAD model is displayed as a wire-frame model, an entity that the engineer wishes to select may be hidden by another entity. The engineer may be able to transform the model to make the hidden entity visible. For example, to select the back face of a part currently displayed on a computer screen, the engineer may be able to rotate the model until the back face becomes visible. However, in some cases, the back face may not become visible because the back face becomes obscured by another entity.

Manipulating the clipping planes, which determine the portion of the 3D modeling space that is rendered in a modeling window, may also remove obscuring objects. Employing this technique, however, may still require translation or rotation of the model to position the model in such a way as to eliminate obscuring entities. Even then, the entity that the engineer may want to select can still be hidden by another entity.

To address the drawbacks of only being able to transform the model and the modeling space to make obscured entities visible, some commercially available 3D CAD systems provide software tools that allow the selection of obscured entities without having to transform the model. These software tools, however, do not remove the obscuring entities and require the engineer to envision where the desired entity would appear on the computer display if not concealed by one or more other entities. Once the engineer envisions the location of the desired entity, he or she uses a pointing device to position a cursor at the envisioned location and indicates to the 3D CAD system the intention to select an obscured entity (e.g., by pressing a key on the keyboard while pressing a mouse button).

The 3D CAD system then produces a list of entities positioned beneath the cursor location. To produce the entity list, the 3D CAD system executes a procedure that constructs an imaginary line, known as a ray, through the model beginning at the cursor location and in an inward direction perpendicular to the x and y screen axes. The procedure then generates a list of all entities through which the ray passes (possibly within some tolerance value) and presents that list to the engineer, in some cases one entity at a time. If and when the desired entity is presented, the engineer indicates that the desired entity is indeed the entity he or she intends to select.

The entity list may be presented in a dialog box and each entity in the list identified by a system- or user-defined name (e.g., the name of a front face listed above the name of a back face). Alternatively, the entities in the list may be presented by highlighting the entities one at a time in the modeling area. A further presentation technique may allow the user to move the cursor over an entity list in a dialog box thereby causing the respective entity in the modeling area to be highlighted. A 3D CAD system typically highlights the outline of the entities and allows the outline to bleed through other obscuring entities, meaning that even though an entity is behind another, the entity can be perceived by the engineer. Generally, the entities are highlighted one at a time to distinguish each entity from another and to avoid a visually confusing representation of the CAD model. Whether the entities are presented by name in a dialog box or are highlighted in the modeling area, or a combination of both presentation methods, when the desired entity is presented, the engineer must indicate that the desired entity is to be selected (e.g., by selecting the entity name in a dialog box or by pressing a "Yes" button in a dialog box after the desired entity is highlighted).

The process just described consisting of generating a list of entities, presenting the entities in the list to the engineer, and allowing the engineer to indicate which entity to select contains fundamental drawbacks. One drawback is that the engineer must predict the location of the entity he or she wants to select. Being able to predict where the entity would be displayed if visible may be problematic. For small entities more often than large, the engineer may have difficulty placing the cursor over the desired entity. Therefore, many times the entity an engineer wants to select is not included in the entity list generated by the 3D CAD system.

Another drawback is that the engineer may not be able to recognize an entity's name or a highlighted entity when presented. If an entity name is unrecognizable, the engineer must reference another source to discover the name. If several entities are highlighted at once, the engineer may not be able to distinguish one entity from another. Moreover, the engineer's familiarity with a model determines the difficulty that he or she will have in determining which entity is highlighted due to the physical and positional similarities of various entities.

A further drawback is that the process does not permit the engineer to utilize the commonly used selection technique of pointing to an entity and clicking a mouse button. The way in which the engineer indicates that an obscured entity is desired for selection varies among 3D CAD systems. However, using current state of the art 3D CAD systems, pointing to an entity and pressing a mouse button in the way that entities are customarily selected is not possible for the purpose of selecting obscured entities. Rather, the engineer is required to press a mouse button while the cursor is located at an area of the computer screen other than where the entity being selected is positioned. That is, the engineer must concentrate on a dialog box or another user interface element that lists the entity names or awaits confirmation or rejection of a highlighted entity.

A 3D CAD system that addresses the foregoing drawbacks and thereby enables engineers to quickly select obscured entities in a manner in which engineers commonly select entities would enhance the capabilities and ease of use of such a 3D CAD system.

SUMMARY OF THE INVENTION

In general, in one aspect, the invention features a computer-implemented method for selecting an obscured object in a computer-generated model. The method includes displaying a computer-generated model on a computer screen wherein said computer-generated model consisting of a plurality of objects in which a first set of the plurality of objects obscures a second set of the plurality of objects. The method also includes receiving first input data interpreted as an instruction to change a visibility characteristic of a first one of the first set of the plurality of objects (the first one of the first set identified by determining that the first one of the first set shares a same location on the computer screen as a cursor), and modifying a visibility characteristic of the first one of the first set to cause a first one of the second set of the plurality of objects to be discernable. Second input data may then be received and interpreted as an instruction to select the first one of the second set of the plurality of objects (the first one of the second set identified upon receiving the second input data and by determining that the first one of the second set shares the same location on the computer screen as the cursor), and the first one of the second set of the plurality of objects may be designated as a first selected object.

Implementations may include one or more of the following features. Modifying a visibility characteristic may cause objects to become transparent and discernable or to become invisible, and/or may cause the removal of objects from a display structure used for constructing the computer-generated model. Designating objects may include highlighting the objects (e.g., by displaying a border and/or changing a color). The method may include receiving data from a pointing device (e.g., a mouse). The computer-generated model may be a solid model and ones of the pluralities of objects may be a face, an edge, a vertex, and/or a surface of the model. Subsequent to designating the first one of the second set of the plurality of objects as a first selected object, the first one of the first set of the plurality of objects may be restored to an initial visibility state. Additional input data may be received and interpreted as an instruction to select a second one of the second set of objects, the second one of the second set identified upon receiving input data and by determining that the second one of the second set shares the same location on the computer screen as the cursor.

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

The present invention facilitates the selection of entities obscured by other entities displayed on a computer screen. A 3D CAD system that implements the present invention enables an engineer to temporarily hide obscuring entities, thus making other entities visible and easy to select using a commonly used selection technique to which he or she is accustomed.

Figure 1:
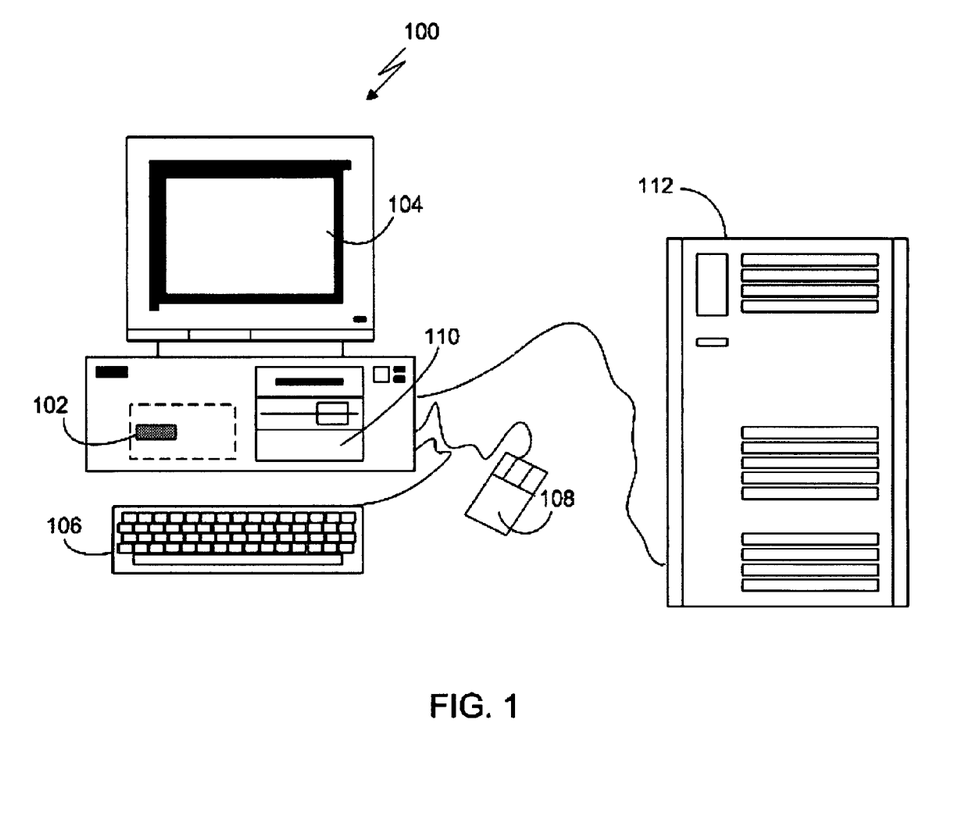
FIG. 1 is a diagram of a computer system.

FIG. 1 shows a computerized modeling system 100 that includes a CPU 102, a CRT 104, a keyboard input device 106, a mouse input device 108, and a storage device 110. The CPU 102, CRT 104, keyboard 106, mouse 108, and storage device 110 can include commonly available computer hardware devices. For example, the CPU 102 can include a Pentium®-based processor. The mouse 108 may have conventional left and right buttons that the user may press to issue a command to a software program being executed by the CPU 102. As an alternative or in addition to the mouse 108, the computerized modeling system 100 can include a pointing device such as a trackball, touch-sensitive pad, or pointing device and buttons built into the keyboard 106. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft WINDOWS NT®, WINDOWS® 98, WINDOWS® 2000, WINDOWS XP®, WINDOWS® ME, UNIX®, LINUX®, or MAC OS® operating systems.

Additional computer processing units and hardware devices (e.g., video and printer devices) may be included in the computerized modeling system 100. Furthermore, the computerized modeling system 100 may include network hardware and software thereby enabling communication to a hardware platform 112. Computerized modeling system 100 may also be connected to a computer network for facilitating communication between numerous computer systems (e.g., a hardware platform 112 that includes a CPU and a storage system, among other computer components).

Computer-aided design (CAD) modeling software may be stored on the storage device 110 and is loaded into and executed by the CPU 102. The modeling software allows an engineer to create and modify a 3D model and implements aspects of the invention described herein. The CPU 102 uses the CRT 104 to display a 3D model and other aspects thereof as described later in more detail. Using the keyboard 106 and the mouse 108, the design engineer can enter and modify data associated with the 3D model. The CPU 102 accepts and processes input from the keyboard 106 and mouse 108. The CPU 102 processes the input along with the data associated with the 3D model and makes corresponding and appropriate changes to that which is displayed on the CRT 104 as instructed by the modeling software.

Figure 2:
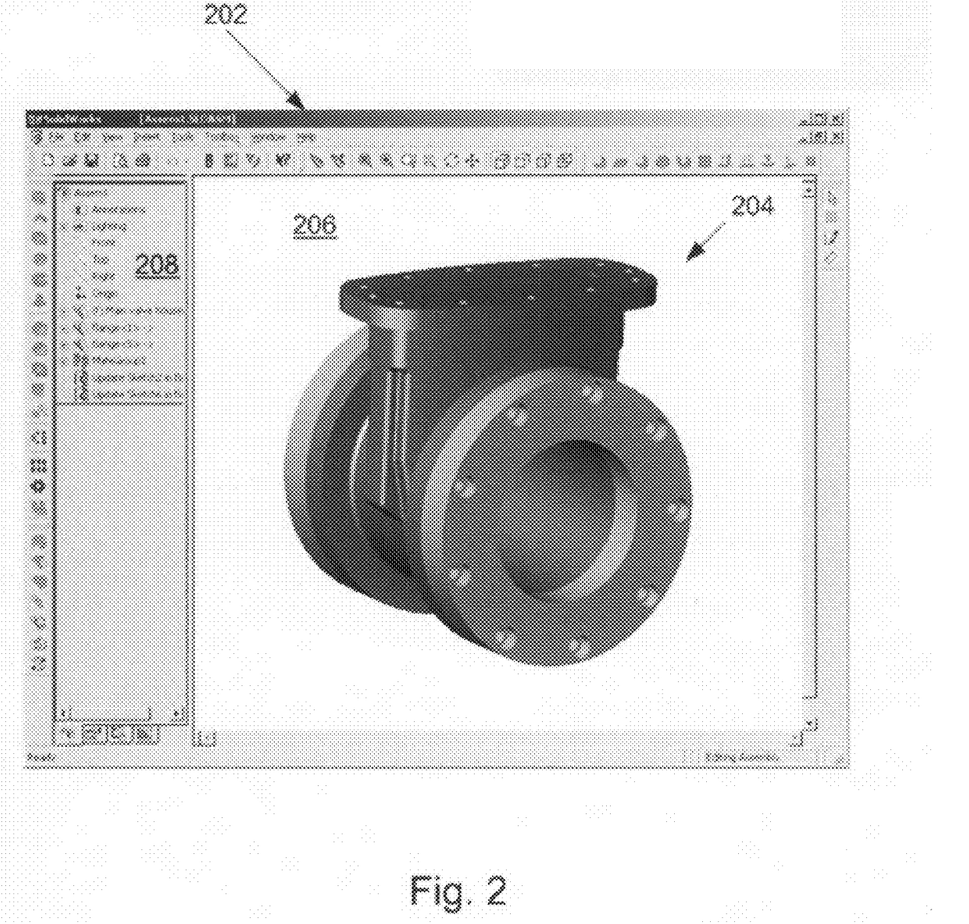
FIG. 2 is an illustration of a model displayed in a window.

FIG. 2 shows a window 202 displayed on the CRT 104 and generated by the CAD modeling software. The window 202 is a conventional computer-generated window that can be programmed by one of ordinary skill in the art using conventional, commercially available, software programming tools, such as those available from Microsoft Corporation of Redmond, Wash.

A computer-generated 3D model 204 is displayed within a modeling portion 206 of the window 202. A design engineer can construct and modify the 3D model 204 in a conventional manner. The surfaces of the 3D model 204 can be displayed, or the 3D model 204 can be displayed using solid lines and dashed lines to show visible edges and hidden edges, respectively, of the 3D model. Implementations also may include other window areas, such as a list of features 208, which helps the engineer visualize and manipulate the model 204 shown in the modeling portion 206.

In one embodiment, the modeling system is a solid modeling system that may be used to model an assembly of solid model components. The 3D model 204 may be an assembly of parts, where each part is comprised of entities such as faces, edges, and vertices. An engineer may select one part in the assembly to reposition the part or modify an attribute, for example. The engineer may also select one or more entities in one or more parts, for example, to create a parametric relationship between two or more entities or change the dimensions of an entity. As shown in FIG. 2, only the entities that are positioned in the front outer portion of the 3D model 204 are visible.

To select one or more parts or entities that are concealed from the engineer, the engineer must have the ability to select concealed objects. To facilitate the selection of concealed objects, the present invention temporarily hides obscuring objects so that previously hidden objects become visible and selectable using the customary point-and-click selection technique whereby the engineer places the cursor on an object and presses a mouse button to indicate the selection of that object.

Figure 3:
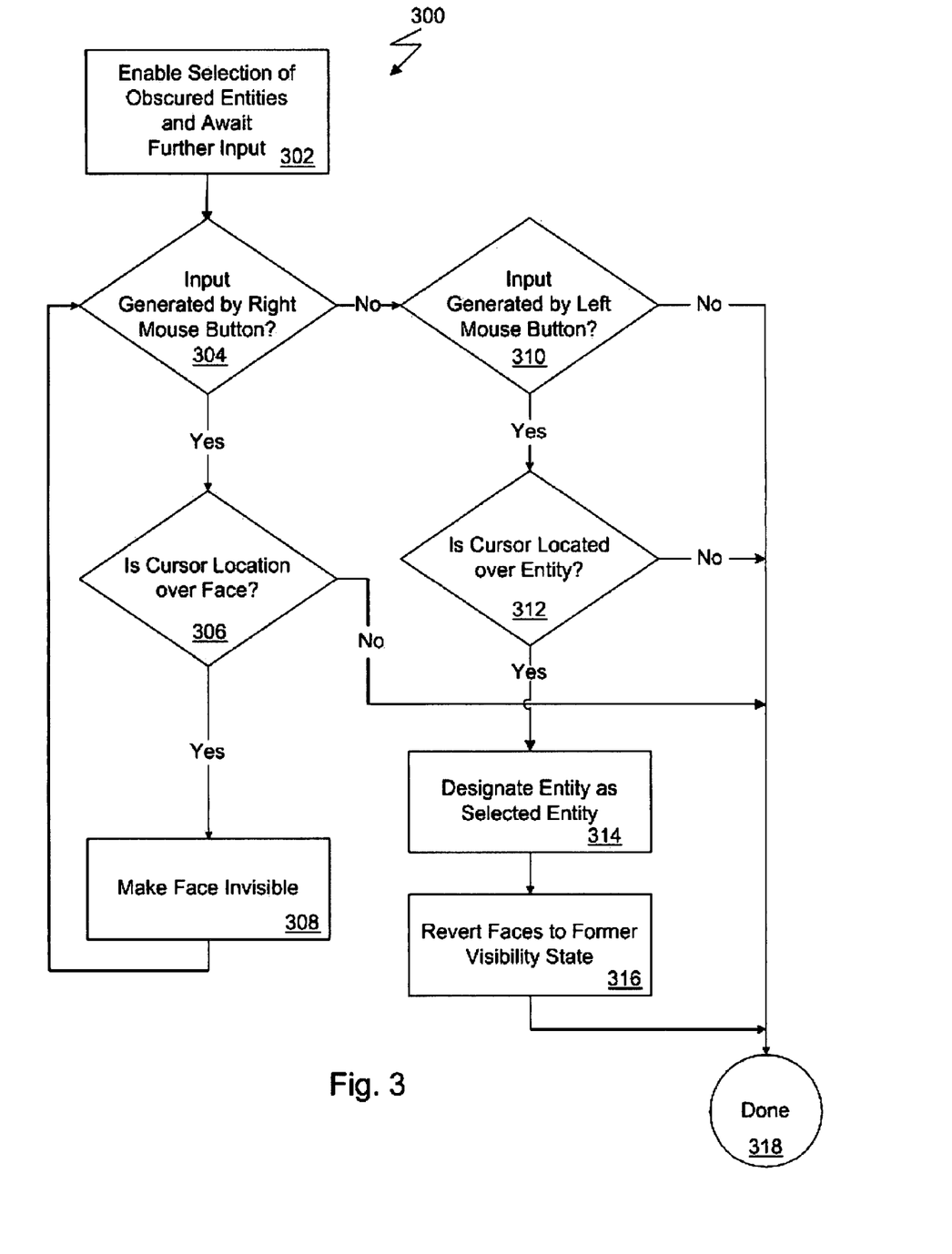
FIG. 3 is a flowchart of a procedure to reveal obscured objects.

FIG. 3 shows a flowchart of a selection procedure 300 that facilitates the selection of obscured entities by removing faces. The selection procedure 300 begins when the CAD system receives instructions to enable the selection of obscured entities and awaits further input (step 302). By way of non-limiting example, instructing the CAD system thus may be initiated when the engineer chooses an item from a user interface menu or an icon from a user interface toolbar. The procedure 300 continues when further input is received and then determines whether the input is generated by the right mouse button (step 304), and if so, determines whether the cursor position is over a face (step 306). A determination that the input is generated by the right mouse button and the cursor position is over a face causes the procedure 300 to make the face positioned immediately beneath the cursor location invisible (step 308), and thereby causes entities behind the face to become visible.

Other embodiments of the present invention can implement alternative means for revealing entities initially hidden. In one embodiment, rather than only one face becoming invisible, the entire part in which the face belongs may become invisible. Other embodiments can make the face or the entire part transparent but perceivable. Generally, an implementation of the present invention may modify a visibility state (e.g., by modifying a visibility attribute), of an obscuring face or an obscuring part so that previously obscured entities become discernible. By way of non-limiting example, a display override can be used to ensure that a value of a property, such as a transparency value, prevails over other related properties until such display override is removed. Moreover, an implementation may enable the engineer to specify whether an entity should be made completely invisible or rendered with some degree of transparency. Additionally, rather than modifying a visibility attribute, an embodiment of the present invention can remove the obscuring entity from a display list or a display structure used for the construction of a 3D model and programmed by one of ordinary skill in the art.

The entity that the engineer wishes to select may or may not be visible after the removal of an outer face. Thus, the present invention enables additional faces to become invisible by simply permitting the engineer to point the cursor at another face and click the right mouse button. So long as the system continues to receive input from the right mouse button (tested in step 304) and recognizes that the input was generated while the cursor is located over a face (tested in step 306), the system makes the face positioned immediately beneath the cursor invisible (step 308).

When procedure 300 determines that the input was not generated by the right mouse button, the procedure 300 determines whether the input was generated by the left mouse button (step 310). If the determination is made that input is received from the left mouse button, procedure 300 then determines whether the cursor is located over an entity in the model (step 312). Input generated by the left mouse button while the cursor is over an entity indicates that the entity is the previously obscured entity that the engineer wishes to select. In the next step, the system designates that entity as the selected entity (step 314). Subsequently, all faces that were made invisible in order to reveal other entities revert to their former visibility state (step 316) before the procedure completes (step 318).

The determination that one of the mouse buttons generated input while the cursor points to an entity causes that entity to become invisible or to be selected for a subsequent operation. Therefore, if the input was not generated by either mouse button, the procedure 300 completes (step 318). Likewise, if the input was generated by one of the mouse buttons when the cursor location was not over an entity, the procedure completes (step 318).

Figure 4A:
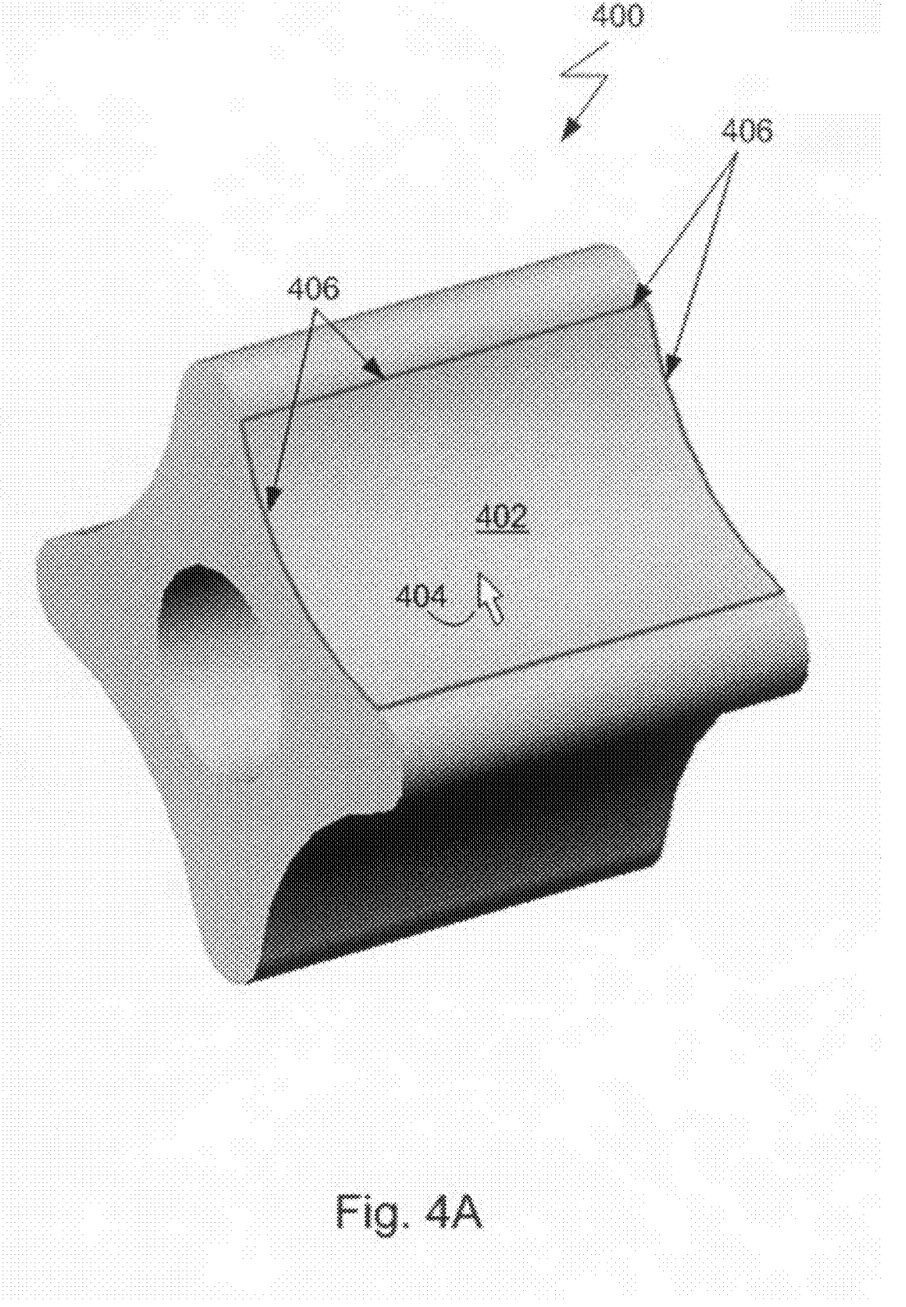
FIG. 4A is an illustration of a CAD model.

FIGS. 4A through 4D illustrate a model 400 during different steps in a process that enables the selection of obscured objects. Referring now to FIG. 4A, the model 400 is shown after the CAD system is enabled to select obscured objects. An outer face 402 is located beneath a cursor 404. The outer face 402 is selected, as made evident by the highlighted border 406 of the outer face 402.

Figure 4B:
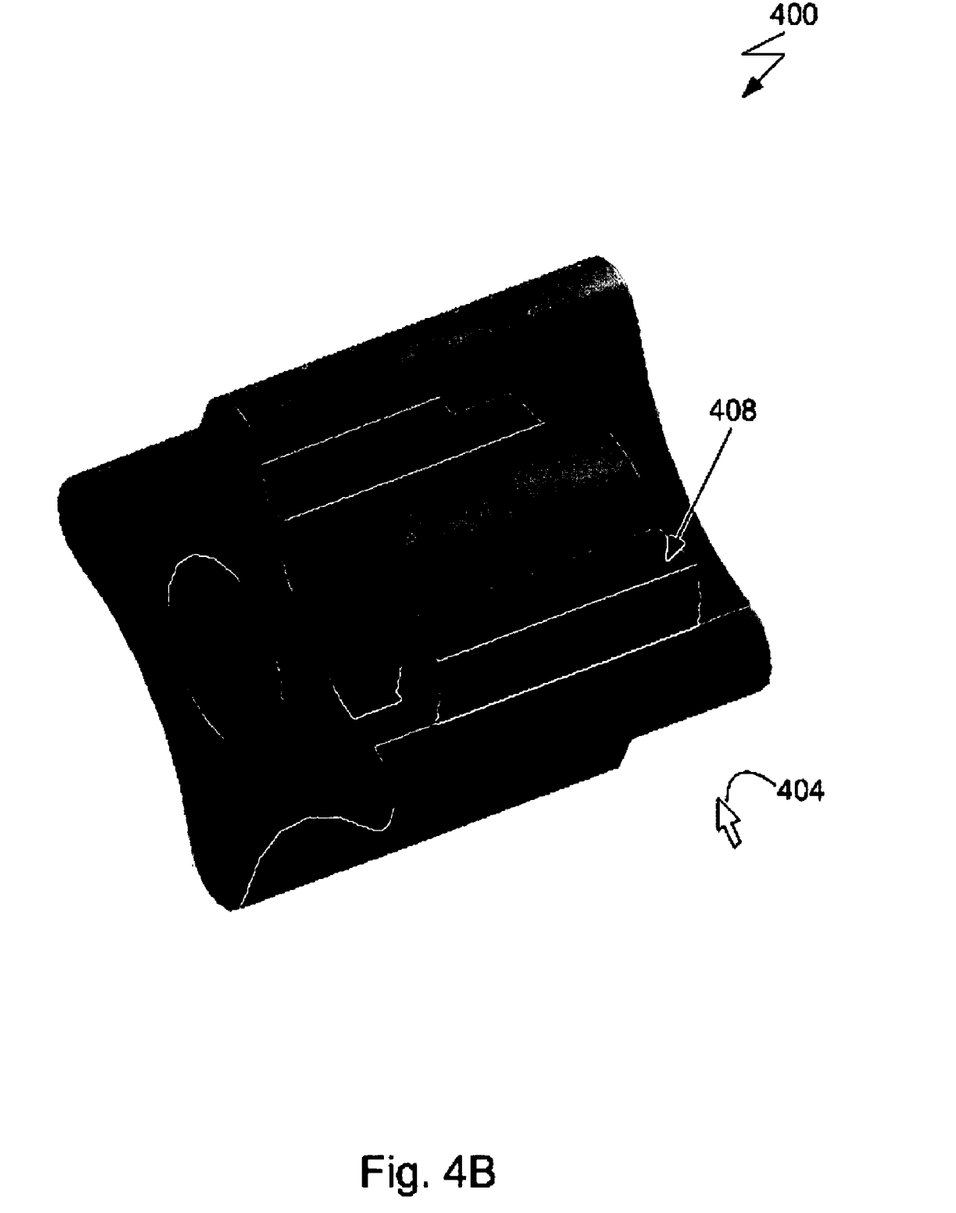
FIG. 4B is an illustration of a CAD model with an outer face removed.

FIG. 4B shows model 400 with the outer face 402 removed (and therefore, not shown) to reveal the face 408. Model 400 takes on the appearance shown in FIG. 4B after the CAD system determines that the right mouse button was pressed while the cursor 404 was positioned over the outer face 402.

Figure 4C:
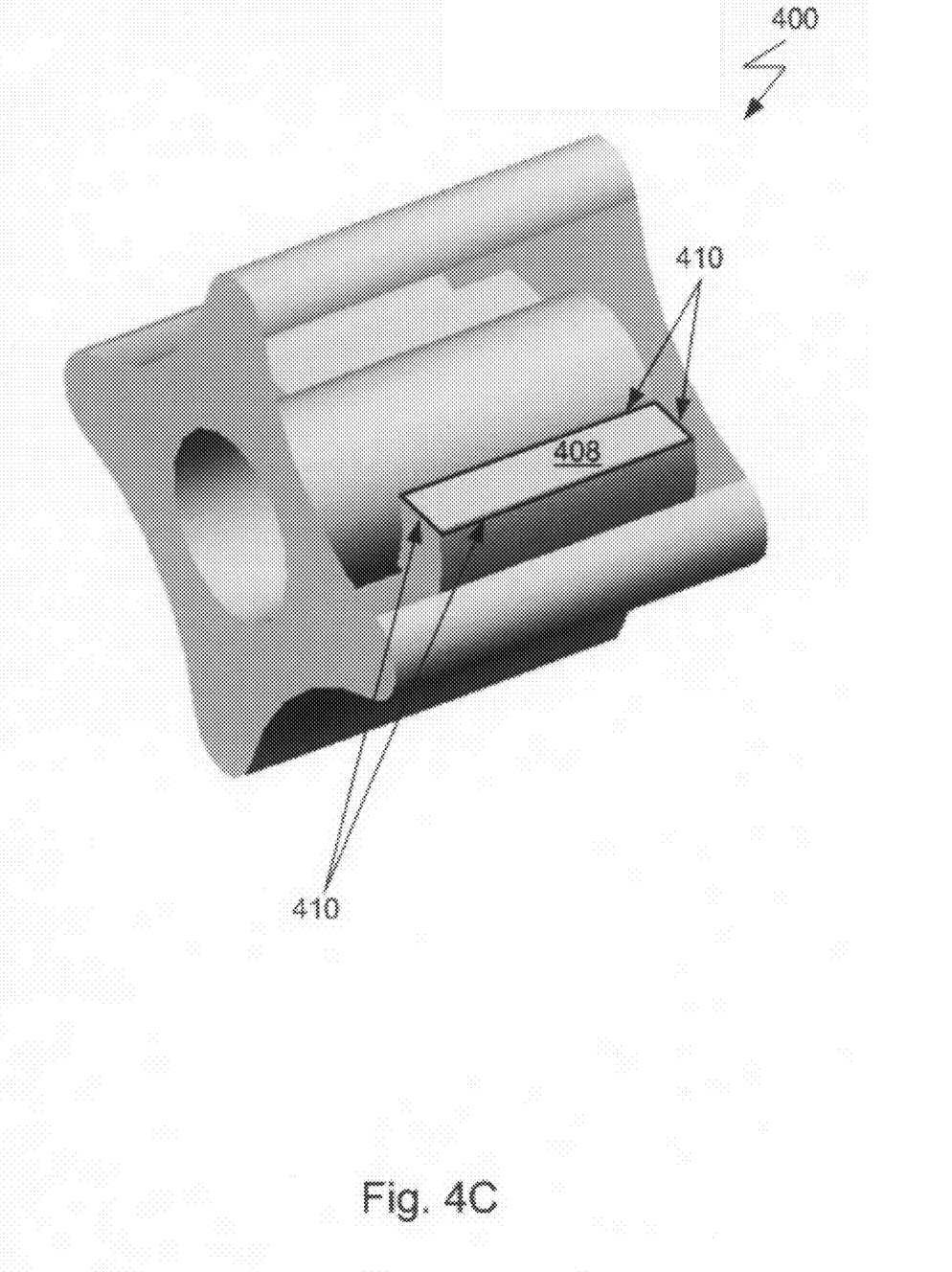
FIG. 4C is an illustration of a CAD model with a revealed inner face selected.

Referring now to FIG. 4C, the revealed face 408 is selected for a subsequent operation. To provide visual feedback that the revealed face 408 has indeed been selected, the edges 410 of the revealed face 408 are highlighted. As previously described with reference to procedure 300, the revealed face 408 can be selected for a subsequent operation when a determination is made that input was generated by the left mouse button while the cursor is located over the revealed face 408.

Figure 4D:
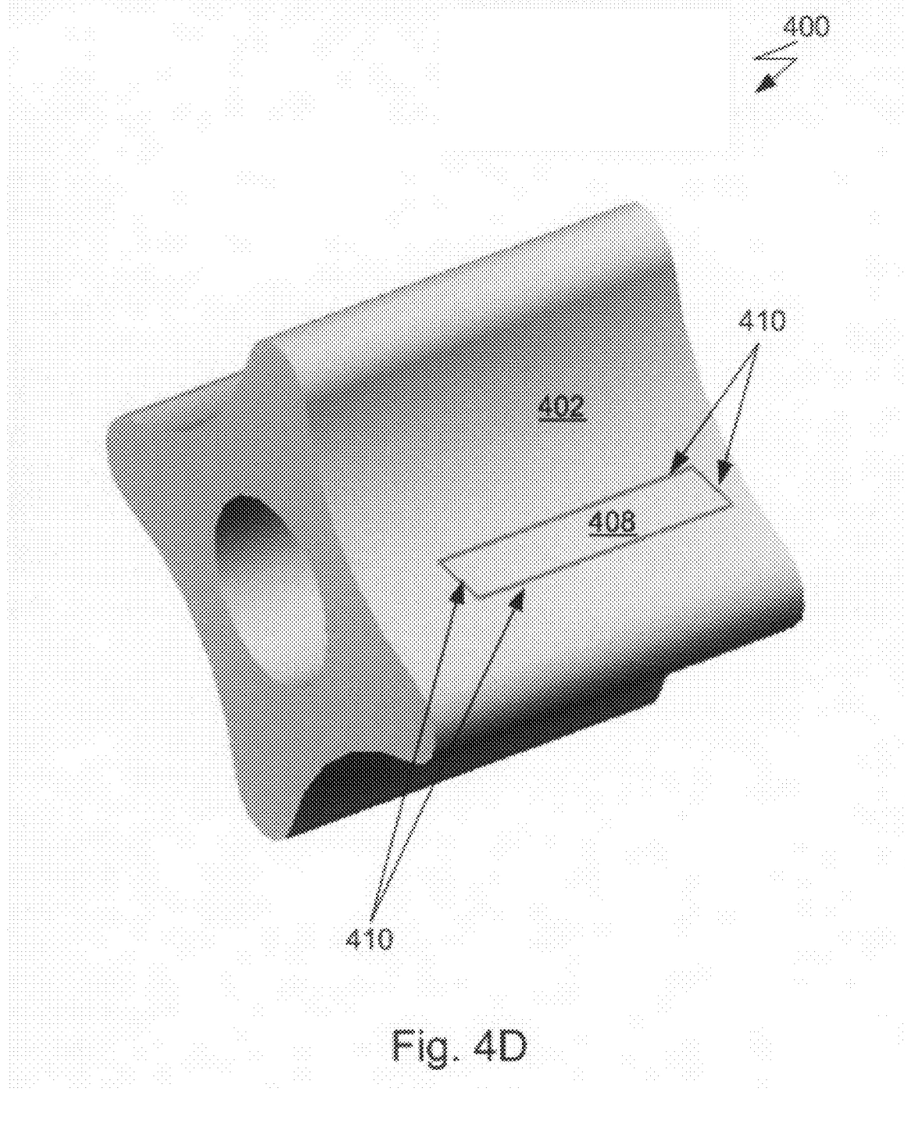
FIG. 4D is an illustration of a CAD model with an inner face highlighted.

FIG. 4D shows model 400 after the revealed face 408 was selected. The outer face 402 is visible because, as previously described, faces that became invisible revert to their previous visibility state. Moreover, as shown in FIG. 4D, the edges 410 of the revealed face 408 remain highlighted so that the revealed face 408 remains discernable for subsequent operations.

The present invention also permits the selection of more than one revealed entity for a subsequent operation. In one embodiment, input data other than the input data heretofore discussed (i.e., input received from the left or right mouse button while the cursor is located over an entity), instructs the CAD system to make a multiple selection of revealed entities. The input sequence may be comprised of the combination of input generated by a keyboard component (e.g., the control key) and input generated by a mouse button while the cursor is located over an entity. By way of non-limiting example, multiple entities may be selected for a subsequent operation when the control key and left mouse button are pressed contemporaneously while the cursor is positioned over an entity.

Figure 5:
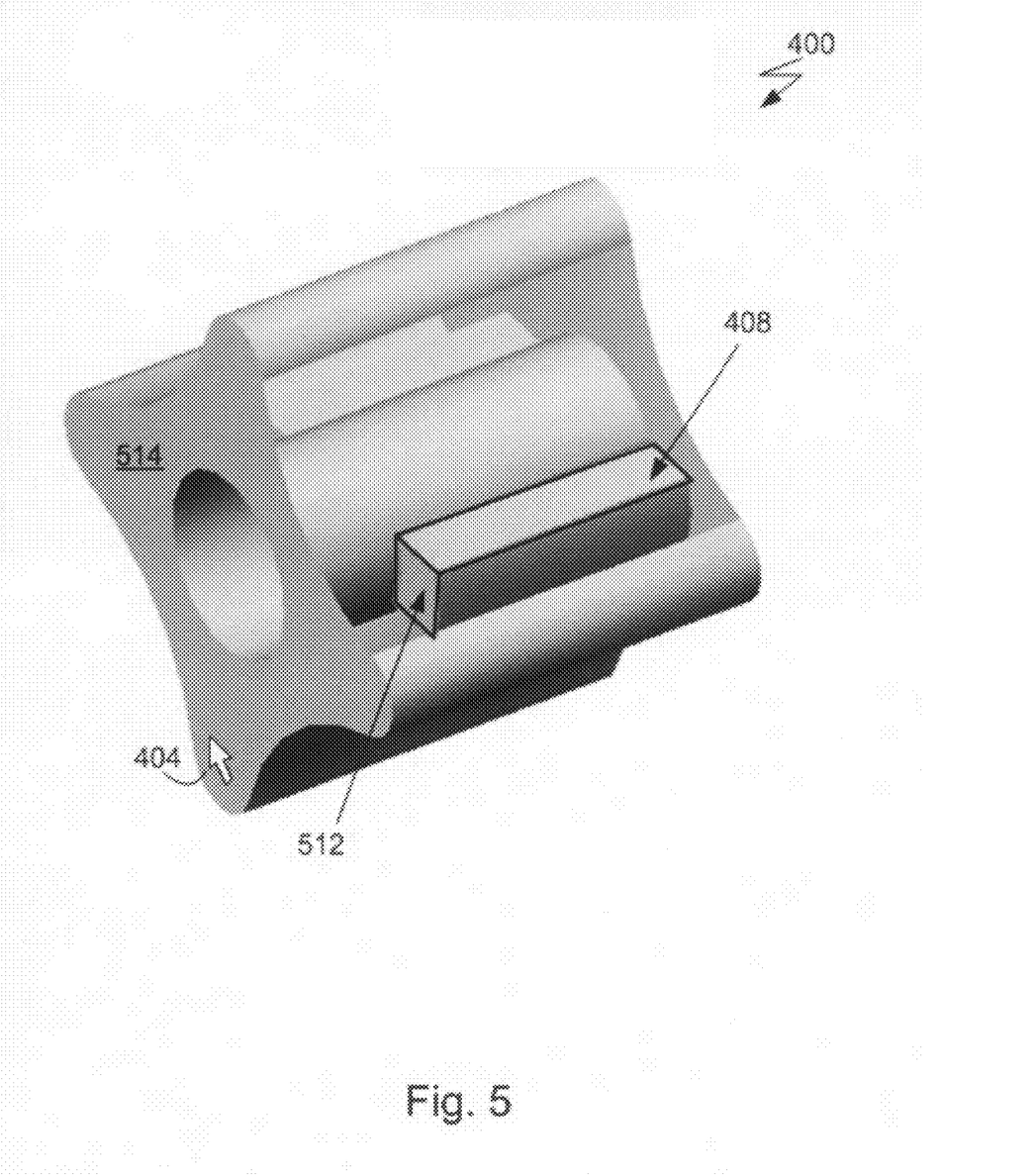
FIG. 5 is an illustration of a CAD model with multiple faces selected.

Referring now to FIG. 5, a multiple selection of revealed entities is shown. Revealed face 408 is selected as is a second revealed face 512. The multiple selection of revealed entities shown in FIG. 5 occurs when the present invention receives contemporaneous input from the left mouse button and control key while the cursor is over revealed face 408, then receives further contemporaneous input from the left mouse button and the control key while the cursor is over revealed face 512.

Once the CAD system is commanded to enable the selection of obscured entities, entities can be removed and selected for a subsequent operation in any order. By way of non-limiting example, once a revealed entity is selected, additional faces can be removed to reveal another entity to select for a subsequent operation. As shown in FIG. 5, face 514 beneath cursor 404 obscures one or more additional entities and can be removed as shown in FIG. 6.

The 3D CAD system determines whether to remove or select the entity pointed to by the cursor based on the analysis of an input sequence. As previously discussed, contemporaneous input received from the control key and the left mouse button while the cursor is positioned over an entity causes an additional entity to be added to the selection. An additional entity is removed from the model when the 3D CAD system receives input from the right mouse button while the cursor is positioned over an entity.

As previously discussed with reference to FIG. 3, faces revert to a previous visibility state once an entity is selected. However, an implementation of the present invention may only restore the faces that were hidden when input is received that commands the 3D CAD system to restore those faces. By way of non-limiting example, faces may revert to their previous visibility state after the 3D CAD system receives contemporaneous input from the control key and right mouse button. Additionally, another specific input stream may instruct the 3D CAD system to complete the selection process.

Figure 6:
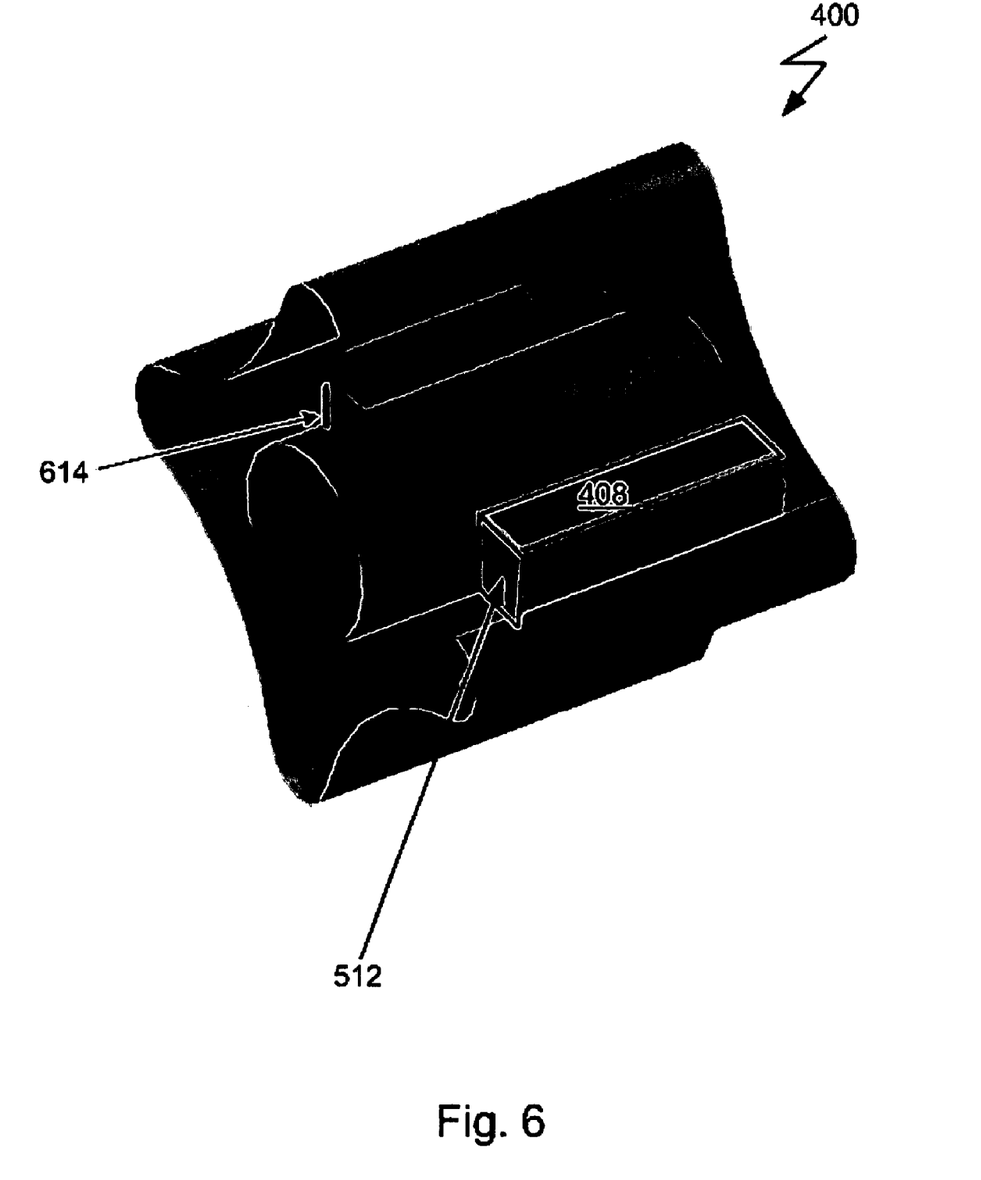
FIG. 6 is an illustration of a CAD model with entities selected and removed.

Referring now to FIG. 6, the model 400 has face 514 removed (shown in FIG. 5) in addition to face 402 (shown in FIG. 4A). As shown in FIG. 6, edge 614, which is revealed when face 514 is removed, is selected in addition to face 408 and face 512.

A further enhancement to the present invention enables two adjacent faces to be removed when a common edge or common vertex of the adjacent faces is designated for removal. By way of non-limiting example, after an entity identified as a common edge of two adjacent faces is designated for removal, the present invention automatically removes the two adjacent faces that share the common edge. Thus, more than one entity can be removed simultaneously without further user interaction.

The present invention offers several advantages to users of 3D CAD systems. A key advantage is the ability for the engineer to view the actual objects he or she wishes to select, as is done with non-obscured objects. Other advantages include the ability to use standard point-and-click selection techniques using a pointing device, such as a mouse, and the use of standard visual aids such as dynamic highlighting for visual cues to aid in the selection of obscured objects as is done with non-obscured objects. A further advantage is that by pointing a cursor at an object and pressing a button associated with a pointing device, and without re-initiating the procedure that enables the selection of obscured entities, more than one obscuring object can be removed from the modeling portion of a window (or made transparent) and more than one obscured object can be selected. Moreover, the engineer does not need to predict where the obscured object is positioned in the modeling portion of a window so that the object or a representation thereof can appear in a list of entities presented to the engineer; rather, the engineer can select the rendered object directly and not be forced to select an indirect representation of the object (e.g., the name of the object in a dialog box). Additionally, the engineer does not need to consider a number of unwanted objects, possibly one at a time, before being presented and considering the desired object.

Implementations may change the order in which operations are performed. Furthermore, depending on the needs of an implementation, particular operations described herein may be implemented as a combined operation, eliminated, added to, or otherwise rearranged. For example, a menu selection to enable the selection of obscured entities may not be necessary in some implementations; rather, contemporaneous input from the mouse and the keyboard devices may cause the selection techniques described herein to be enabled, and such input may also cause an entity to become invisible. Moreover, in FIG. 3, step 316 may be omitted, meaning that entities that became invisible will not revert to their initial state of visibility upon selection of an entity. Alternatively, the present invention may permit the engineer to determine when entities should be restored to their original visibility state and allow the engineer to instruct the system to do so.

Although the foregoing description disclosed that the selected entities are depicted by highlighting the edges of the selected entities, other visual cues may also distinguish a selected object. By way of non-limiting example, a CAD system may highlight a selected face by modifying the color of the selected face or a selected object may blink on and off to alert the engineer that the object is selected.

The present invention may also implement filtering techniques familiar to one of ordinary skill in the art, such that only one or more specific types of objects can be selected. For example, a selection filter may be set to allow an engineer to pick only edges in a 3D model thereby preventing the accidental selection of other objects such as a face, a vertex, a dimension, or a sketch entity, even if those objects are very close in proximity to an edge.

Furthermore, an implementation of the present invention may allow for other user interactions than those described while entities are being removed and selected for a further operation. By way of non-limiting example, input may be generated by the keyboard and processed in such a way as to cause the 3D model to be rotated, without exiting the procedure described with reference to FIG. 3 thereby allowing a user to continue selecting objects.

Additionally, although the embodiment described herein describes a CAD modeling system used by engineers, other computer applications can attain enhanced capabilities from the present invention and users of those other systems can benefit from the improved ease of use of such systems. As an example, computer animation and styling systems can gain advantages from implementing the selection methods described herein. Consider that a styling system primarily renders surfaces, and that outer surfaces or facets thereof may obscure inner surfaces or facets thereof. An implementation of the present invention can enable outer surface objects to be removed to reveal inner surface objects.

Accordingly, other embodiments are within the scope of the following claims.

What is claimed is:

1. A computer-implemented method for selecting an obscured object in a three-dimensional computer-generated model, the method comprising:
    displaying the three-dimensional computer-generated model on a computer screen, wherein:
        the thee-dimensional computer-generated model consists of a plurality of objects used to construct a part;
        a first set of the plurality of objects when displayed obscures a second set of the plurality of objects;
        the first set of the plurality of objects comprises a face, the face having a visibility characteristic that may be independently changed; and
        the second set of the plurality of objects comprises a face, the face having a visibility characteristic that may be independently changed;
    receiving first input data interpreted as an instruction to change a visibility characteristic of a first object of the first set of the plurality of objects, the first object of the first set identified upon receiving the first input data and by determining that the first object of the first set shares a same location on the computer screen as a cursor;
    automatically modifying the visibility characteristic of the first object of the first set to cause a first object of the second set of the plurality of objects to be discernable;
    receiving second input data interpreted as an instruction to select the first object of the second set of the plurality of objects, the first object of the second set identified upon receiving the second input data and by determining that the first object of the second set shares the same location on the computer screen as the cursor; and
    designating the first object of the second set of the plurality of objects as a first selected object.

2. The computer-implemented method of claim 1, wherein:
    modifying the visibility characteristic automatically causes the first object of the first set of the plurality of objects to become transparent and discernable.

3. The computer-implemented method of claim 1, wherein:
    modifying the visibility characteristic automatically causes the first object of the first set of the plurality of objects to become invisible.

4. The computer-implemented method of claim 1, wherein:
    modifying the visibility characteristic automatically causes the removal of the first object of the first set of the plurality of objects from a display structure used for constructing the computer-grated model.

5. The computer-implemented method of claim 1, wherein:
    designating the first object of the second set of the plurality of objects comprises highlighting the first object of the second set of the plurality of objects.

6. The computer-implemented method of claim 5, wherein:
    highlighting the first object of the second set of objects comprises one of displaying a border of the first object of the second set of the plurality of objects and changing a color of the first object of the second set of the plurality of objects.

7. The computer-implemented method of claim 1, wherein:
    a pointing device grates the first input data; and
    the pointing device grates the second input data.

8. The computer-implemented method of claim 7, wherein:
    the pointing device is a mouse device.

9. The computer-implemented method of claim 1, wherein:
    the thee-dimensional computer-grated model is a solid model; and
    the first object of the first set of the plurality of objects is a face.

10. The computer-implemented method of claim 9, wherein:
    the first object of the second set of the plurality of objects is one of a face, an edge, a vertex, and a surface.

11. The computer-implemented method of claim 1, wherein:
    the thee-dimensional computer-grated model is a solid model;
    the first object of the first set of the plurality of objects is one of a vertex or an edge;
    and further comprising:
    automatically modifying a visibility characteristic of a first face adjacent to the first object of the first set of the plurality of objects; and
    automatically causing at least one of the plurality of objects positioned behind the first face to be visible.

12. The computer-implemented method of claim 1, wherein:
    subsequent to designating the first object of the second set of the plurality of objects as a first selected object, automatically reverting the first object of the first set of the plurality of objects to an initial visibility state.

13. The computer-implemented method of claim 1, further comprising:
    receiving third input data interpreted as an instruction to select a second object of the second set of the plurality of objects, the second object of the second set identified upon receiving the third input data and by determining that the second object of the second set shares the same location on the computer screen as the cursor; and
    highlighting the second object of the second set of the plurality of objects for distinguishing the second object of the second set as a second selected object.

14. The computer-implemented method of claim 1, further comprising:
    receiving third input data interpreted as an instruction to change a visibility characteristic of a second object of the first set of the plurality of objects, the second object of the first set identified upon receiving the third input data and by determining that the second object of the first set shares the same location on the computer screen as the cursor;
    automatically modifying the visibility characteristic of the second object of the first set of the plurality of objects to reveal a second object of the second set of the plurality of objects positioned behind the second object of the first set;
    receiving fourth input data interpreted as an instruction to select the second object of the second set of the plurality of objects, the second object of the second set identified upon receiving the fourth input data and by determining that the second object of the second set shares the same location on the computer screen as the cursor;
    designating the second object of the second set of the plurality of objects as a second selected object; and highlighting the second object of the second set of the plurality of objects to visually indicate the designation as a second selected object.

15. The computer-implemented method of claim 14, wherein:
automatically modifying the visibility characteristic of the second object of the first set of the plurality of objects causes the second object of the first set to become transparent and discernable.

16. The computer-implemented method of claim 14, wherein:
automatically modifying the visibility characteristic of the second object of the first set of the plurality of objects causes the second object of the first set to become invisible.

17. The computer-implemented method of claim 14, wherein:
automatically modifying the visibility characteristic of the second object of the first set of the plurality of objects causes the removal of the second object of the first set from a display structure used for constructing the computer-grated model.

18. A computer executable program residing on a computer readable medium, the program comprising instructions causing a computer to:
enable selection of at least one of a plurality of obscured objects;
receive first input data grated by a first button while a cursor positioned in accordance with data from a pointing device is located over a first object;
determine that the first object is an edge used in the construction of a solid model;
automatically modify a visibility characteristic of at least one of a plurality of faces sharing the edge to reveal a first object of the plurality of obscured objects positioned in a modeling space behind at least one of the plurality of faces;
receive second input data grated by a second button while the cursor positioned in accordance with data from the pointing device is located over the first object of the plurality of obscured objects;
designate the first object of the plurality of obscured objects as a first selected object wherein designating comprises highlighting the first object of the plurality of obscured objects; and
automatically modify the visibility characteristic of at least one of the plurality of faces sharing the edge to a previous visibility state, wherein the visibility characteristic of a face of the plurality of faces may be modified independently from the visibility characteristic of other faces.

19. The computer executable program of claim 18, wherein:
the first object of the plurality of obscured objects is a face; and
highlighting the first object of the plurality of obscured objects comprises one of changing a line texture of a plurality of edges of the face and changing a color of the face.

20. A digital computer comprising:
a memory, data stored in said memory, and control information stored in said memory; and
a data processor for processing said data in accordance with said control information;
wherein,
said control information is arranged to:
process a data structure defining a thee-dimensional model comprised of a plurality of entities used to grate a representation of a real-world three-dimensional object, wherein each one of the plurality of entities is one of a vertex, an edge, a face, and a surface;
receive first input data grated by a button used in conjunction with a pointing device controlling a location of a cursor, wherein the first input data is interpreted as a command to make one of the plurality of entities invisible, wherein a visibility characteristic of a face of the plurality of entities may be independently controlled;
automatically suppress display of a first one of the plurality of entities positioned beneath the cursor when the first input data was received while continuing to display other ones of the plurality of entities;
receive second input data grated by the button, wherein second input data is interpreted as a command to select one of the other ones of the plurality of entities; and
designate a second one of the plurality of entities as a selected entity, the second one designated upon receiving the second input data and determining that the second one shares a common location with the cursor.

21. The digital computer of claim 20, wherein:
the second one of the plurality of entities is a face; and
said control information is further arranged to highlight the second one of the plurality of entities by one of changing a line texture of a plurality of edges of the face and changing a color of the face.

22. The digital computer of claim 20, wherein:
the first one of the plurality of entities is a first edge; and
further comprising control information arranged to automatically suppress display of the face that is adjacent to the first edge.

* * * * *

UNITED STATES PATENT AND TRADEMARK OFFICE
CERTIFICATE OF CORRECTION

| | |
|---|---|
| PATENT NO. | : 7,694,238 B2 |
| APPLICATION NO. | : 10/806571 |
| DATED | : April 6, 2010 |
| INVENTOR(S) | : Mark Gibson et al. |

Page 1 of 1

It is certified that error appears in the above-identified patent and that said Letters Patent is hereby corrected as shown below:

In Column 10, Claim 7, line 2, after "device" change "grates" to --generates--.

In Column 10, Claim 7, line 3, after "device" change "grates" to --generates--.

In Column 10, Claim 9, line 7, before "model" change "computer-grated" to --computer-generated--.

In Column 10, Claim 11, line 17, before "model" change "computer-grated" to --computer-generated--.

In Column 11, Claim 17, lines 21-22, after "constructing the" change "computer-grated" to --computer generated--.

In Column 11, Claim 18, line 28, after "data" change "grated" to --generated--.

In Column 11, Claim 18, line 38, after "data" change "grated" to --generated--.

In Column 12, Claim 20, line 16, before "a representation" change "grate" to --generate--.

In Column 12, Claim 20, line 20, after "data" change "grated" to --generated--.

In Column 12, Claim 20, line 31, after "data" change "grated" to --generated--.

Signed and Sealed this
First Day of November, 2011

David J. Kappos
*Director of the United States Patent and Trademark Office*